United States Patent
Schmitt et al.

(10) Patent No.: US 6,193,208 B1
(45) Date of Patent: Feb. 27, 2001

(54) STABILIZING PEDESTAL FOR COMPUTER SYSTEM TOWER UNITS

(75) Inventors: Ty R. Schmitt, Round Rock; Andrew W. Wilks, Austin, both of TX (US)

(73) Assignee: Dell U.S.A., L.P., Round Rock, TX (US)

(*) Notice: Under 35 U.S.C. 154(b), the term of this patent shall be extended for 87 days.

(21) Appl. No.: 08/850,313

(22) Filed: May 2, 1997

(51) Int. Cl.[7] .................................................. A47G 29/00
(52) U.S. Cl. ........................ 248/688; 248/917; 248/188.8; 248/188
(58) Field of Search ..................................... 248/688, 174, 248/176.2, 678, 919, 676, 188.8, 346, 677, 188, 917

(56) References Cited

U.S. PATENT DOCUMENTS

| | | | | |
|---|---|---|---|---|
| 4,238,101 | * | 12/1980 | Kay ................................... | 248/346.01 |
| 4,368,867 | * | 1/1983 | Fendleton et al. ................. | 248/346.1 |
| 5,020,768 | | 6/1991 | Hardt et al. ........................... | 248/678 |
| 5,263,668 | * | 11/1993 | Reitue .................................... | 248/346 |
| 5,388,792 | * | 2/1995 | Hastings et al. ................... | 248/188.1 |
| 5,397,081 | * | 3/1995 | Landry et al. ........................ | 248/346 |
| 5,457,602 | * | 10/1995 | Kimura et al. ......................... | 361/687 |
| 5,462,350 | * | 10/1995 | Brightman et al. ................ | 312/351.7 |
| 5,584,431 | * | 12/1996 | Clement ................................. | 229/125 |
| 5,749,637 | * | 5/1998 | McMahan et al. ................ | 312/223.2 |

\* cited by examiner

*Primary Examiner*—Leslie A. Braun
*Assistant Examiner*—Kimberly Wood
(74) *Attorney, Agent, or Firm*—Skjerven Morrill MacPherson, LLP; Stephen A. Terrile

(57) ABSTRACT

The stabilizing apparatus of the present invention has the advantages of allowing the computer system tower units to be positioned in close proximity with respect to each other while providing stability for a single or multiple tower units. The present invention provides a stabilizing apparatus for a computer system having one or more tower units with a generally narrow width base with respect to the depth and height of each tower unit. At least one pedestal spans the base of the tower unit in a direction transverse to the depth of the tower unit. The pedestal of the present invention is a single bar having two ends which extend outwardly from opposite sides of the tower unit for preventing the tower unit from overturning. Alternatively, the ends are also angled downwardly for raising the base of the tower unit. Screws are used, for instance, to attach the pedestal to the tower unit. The pedestal of one tower unit is capable of interlacing with the pedestal of another tower unit allowing the tower units to be positioned in close proximity with respect to each other.

20 Claims, 4 Drawing Sheets

STABILIZING PEDESTAL FOR COMPUTER SYSTEM TOWER UNITS

BACKGROUND OF THE INVENTION

1. Field of the Invention

This invention relates to stabilizing apparatus for securing and stabilizing tower type computer system units.

2. Description of the Related Art

It is desirable, in certain instances, to mount computer system units, such as hard disk drive array systems or tower units, in a vertical orientation, mainly due to space constraints. Pedestals are used to allow the tower unit to be mounted in a vertical position and still pass required standard tip tests for computer system units. The primary design goal of a pedestal is to expand the effective foot print of a given tower unit so that it requires a greater force to tip it over. Another important design consideration for pedestals is integration with and between other tower units and pedestals. If a user has multiple tower units mounted in vertical positions and wants to mount them as close to one another as possible, the minimum distance that two adjacent tower units can be stationed is dictated by how far the tower unit's pedestal extends out from the base, e.g. if the tower unit's pedestal extends out two inches and it is stationed next to a similar tower unit such that the front of the systems are aligned with respect to each other, the minimum distance between the two tower units would be four inches.

There are several commercial and private pedestals on the market that are used to provide stability for tower and mini-tower type computer system units. These are intended for stand alone systems and are not designed to allow two systems to stand closely together side by side. These pedestals typically mount to a system tower unit by enveloping the sides of the system tower unit. Therefore, a pedestal is needed which satisfies the necessary tip/push test requirements and still allows two or more like system tower units to be stationed next to one another as close as possible.

SUMMARY OF THE INVENTION

Accordingly, the stabilizing apparatus of the present invention has the advantages of allowing the computer system tower units to be positioned in close proximity with respect to each other while providing stability for a single or multiple tower units. The present invention provides a stabilizing apparatus for a computer system having one or more tower units with a generally narrow width base with respect to the depth and height of each tower unit. At least one pedestal spans the base of the tower unit in a direction transverse to the depth of the tower unit. The pedestal of the present invention is a single bar having two ends which extend outwardly from opposite sides of the tower unit for preventing the tower unit from overturning. Alternatively, the ends are angled downwardly for raising the base of the tower unit. Screws are used, for instance, to attach the pedestal to the tower unit. The pedestal of one tower unit is capable of interlacing with the pedestal of another tower unit allowing the tower units to be positioned in close proximity with respect to each other.

In a first embodiment of the present invention, the ends of each pedestal are angled generally in an S-shape in opposite directions from each other and when two or more tower units are positioned adjacent each other having the front of the tower units aligned with respect to each other, one end of the pedestal on one tower unit is interlaced with one end of the pedestal on the adjacent tower unit.

In a second embodiment of the present invention, one end of the pedestal is a double end and the other end is a single end and when two or more tower units are positioned adjacent each other having the front of the tower units aligned with respect to each other, the single end of the pedestal on one tower unit is interlaced with the double end of the pedestal on the adjacent tower unit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
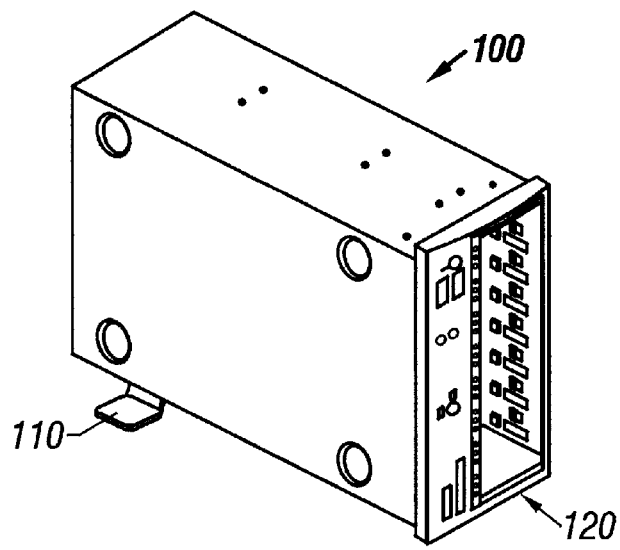
FIG. 1 is a perspective view of a computer system tower unit including a pedestal in accordance with a first embodiment of the present invention.

In the description which follows, the drawing figures are not necessarily to scale and like parts are marked throughout the specification and drawings with the same reference numerals, respectively.

Referring now to FIG. 1, illustrated is a perspective view of a computer system tower unit 100, such as a hard disk drive array system, including a pedestal 110 in accordance with a first embodiment of the present invention. The tower unit 100 has a generally narrow width base 120 with respect to the depth and height of the tower unit 100. The pedestal 110 stabilizes the tower unit 100 and prevents the tower unit 100 from overturning.

Figure 2:
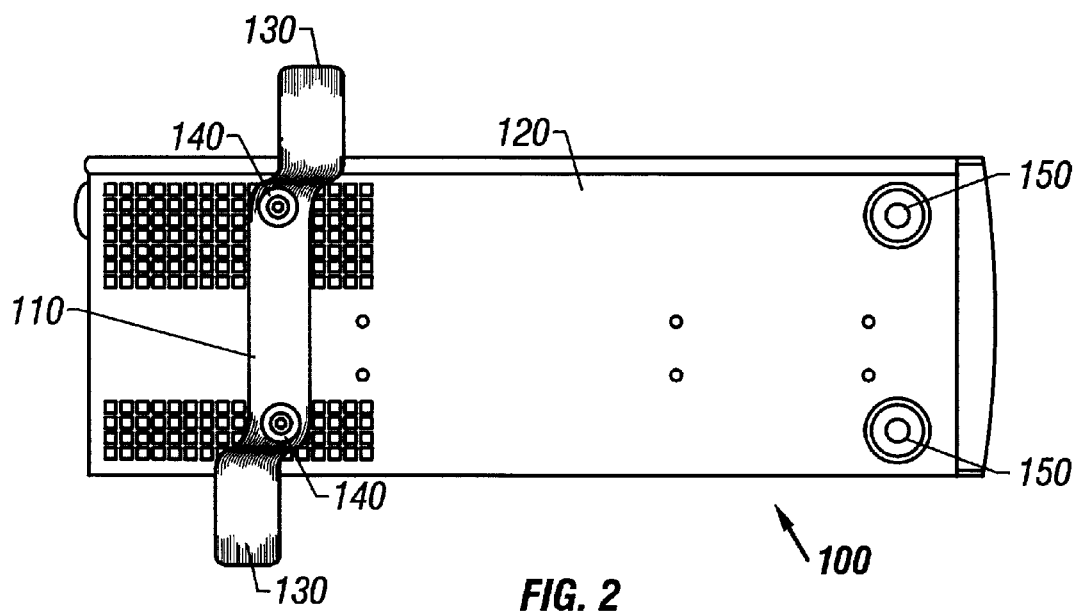
FIG. 2 illustrates a bottom view of the computer system tower unit and the pedestal of FIG. 1.

FIG. 2 illustrates a bottom view of the computer system tower unit 100 and the pedestal 110 of FIG. 1. At least one pedestal 110 spans the base 120 of the tower unit 100 in a direction transverse to the depth of the tower unit 100. The pedestal 110 is a single bar having two ends 130 extending outwardly from opposite sides of the tower unit 100 for preventing the tower unit 100 from overturning. Also, the pedestal's 110 ends 130 are planar (not shown) or, alternatively, angled downwardly, for raising the base 120 of the tower unit 100 to provide, for instance, a venting or cooling space beneath the tower unit 100. The pedestal 110 is attached to the tower unit 100, for instance, with screws 140. When only a single pedestal 110 is used on one end of the base 120 of each tower unit 100, as illustrated in FIG. 2, two footpads 150, for example, are incorporated at the other end of the base 120 of tower unit 100 wherein the pedestal 110 and the footpads 150 raise the base 120 of the tower unit 100 evenly.

Figure 3A:
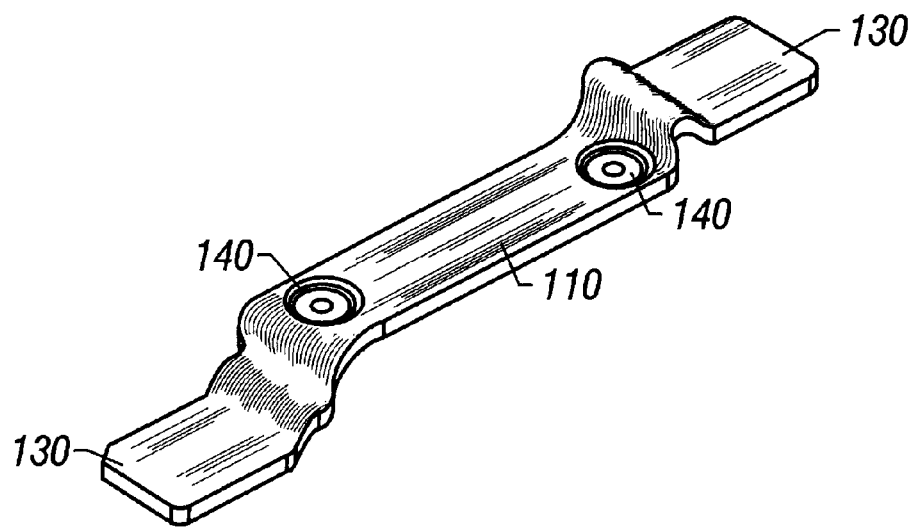
FIGS. 3A and 3B are perspective views of the pedestal of FIG. 1 (FIG. 3A) and two pedestals of FIG. 1 interlaced together (FIG. 3B) in accordance with the first embodiment of the present invention.
Figure 3B:
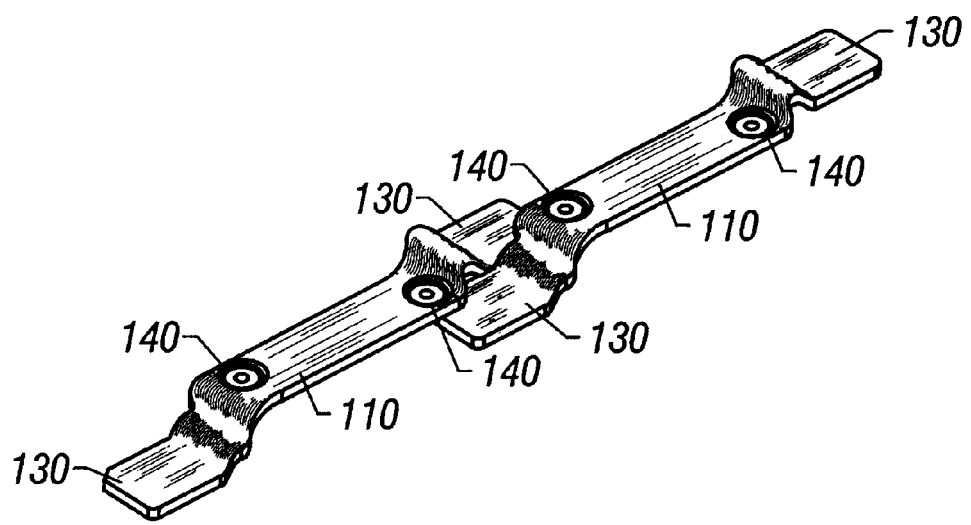

FIGS. 3A and 3B are perspective views of the pedestal 110 of FIG. 1 (FIG. 3A) and two of the pedestals 110 of FIG. 1 interlaced together (FIG. 3B) in accordance with the first embodiment of the present invention. The pedestal 110 is a single bar with two ends 130 wherein the ends 130 are angled generally in an S-shape downwardly, or, alternatively, planar (not shown), and in opposite directions from each other and wherein the ends 130 extend outwardly from opposite sides of the tower unit 100 raising the base 120 of the tower unit 100 and preventing the tower unit 100 from overturning.

Figure 4:
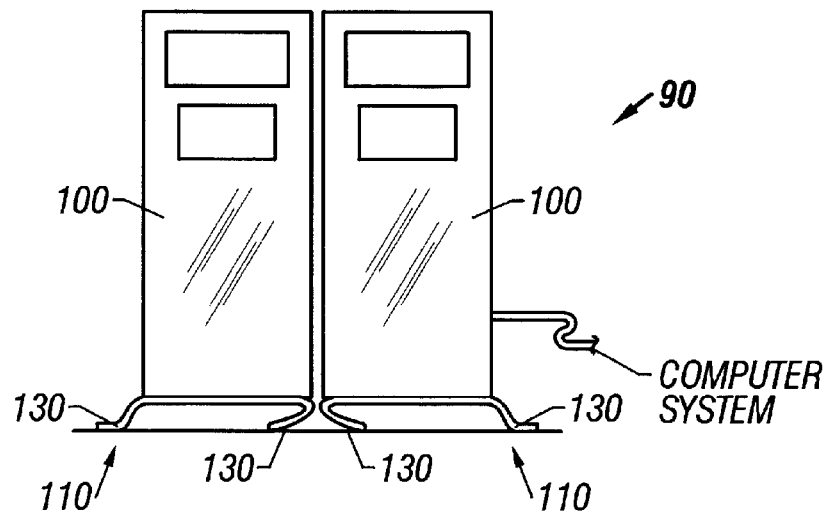
FIG. 4 illustrates a front view of two computer system tower units and the pedestal of FIG. 1 mounted adjacent to and in close proximity to each other.

FIG. 4 illustrates a front view of a computer system 90 including two computer system tower units 100 and pedestals 110 mounted adjacent to each other in accordance with the first embodiment of the invention. When two or more tower units 100 are positioned adjacent each other having the front of the tower units 100 aligned with respect to each other, one end 130 of the pedestal 110 on one tower unit 100 is interlaced with one end 130 of the pedestal 110 on the adjacent tower unit 100 allowing the tower units 100 to be positioned in close proximity with respect to each other. An advantage of the pedestal 110 illustrated in FIG. 4 is that the pedestal 110 may be turned in the opposite direction and still interlace properly with the pedestal 110 on the adjacent tower unit 100.

Figure 5:
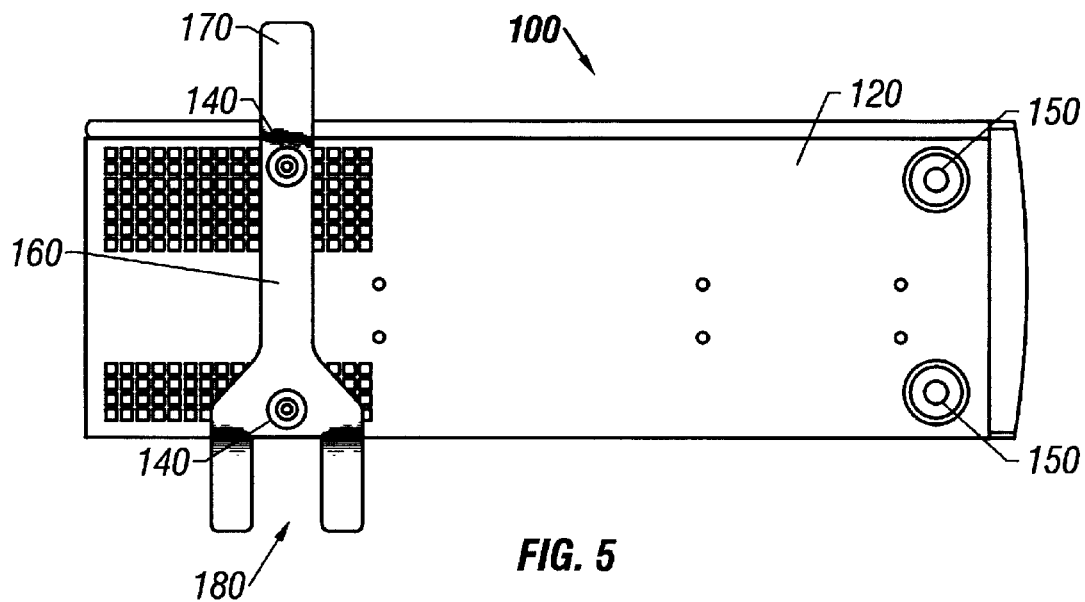
FIG. 5 illustrates a bottom view of a computer system tower unit and a pedestal in accordance with a second embodiment of the present invention.

FIG. 5 is a bottom view of the computer system tower unit 100 illustrating the base 120 of the tower unit 100, footpads 150, and a pedestal 160, in accordance with a second embodiment of the present invention, spanning the base 120 of the tower unit 100 in a direction transverse to the depth of the tower unit 100.

Figure 6A:
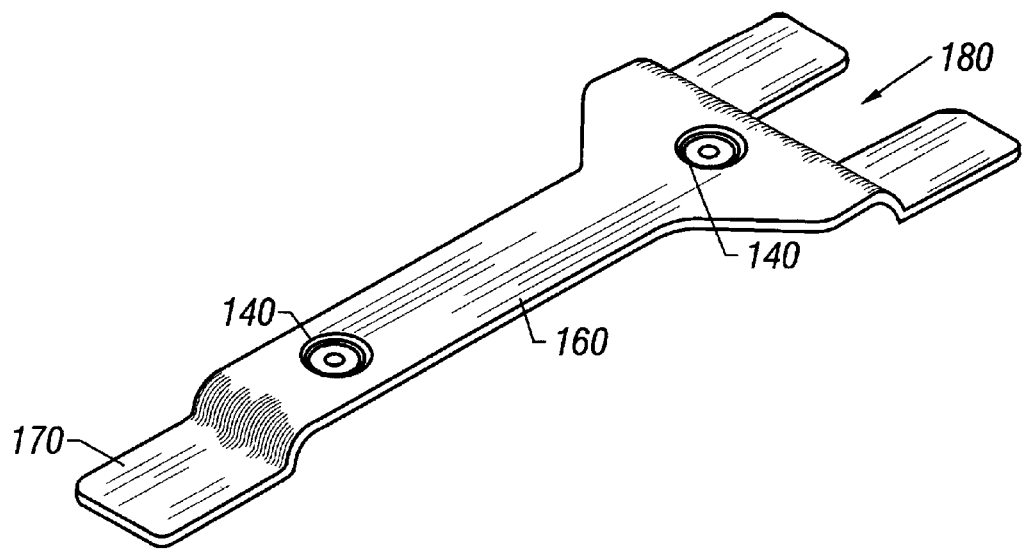
FIGS. 6A and 6B are perspective views of the pedestal of FIG. 5 (FIG. 6A) and two pedestals of FIG. 5 interlaced together (FIG. 6B) in accordance with the second embodiment of the present invention.
Figure 6B:
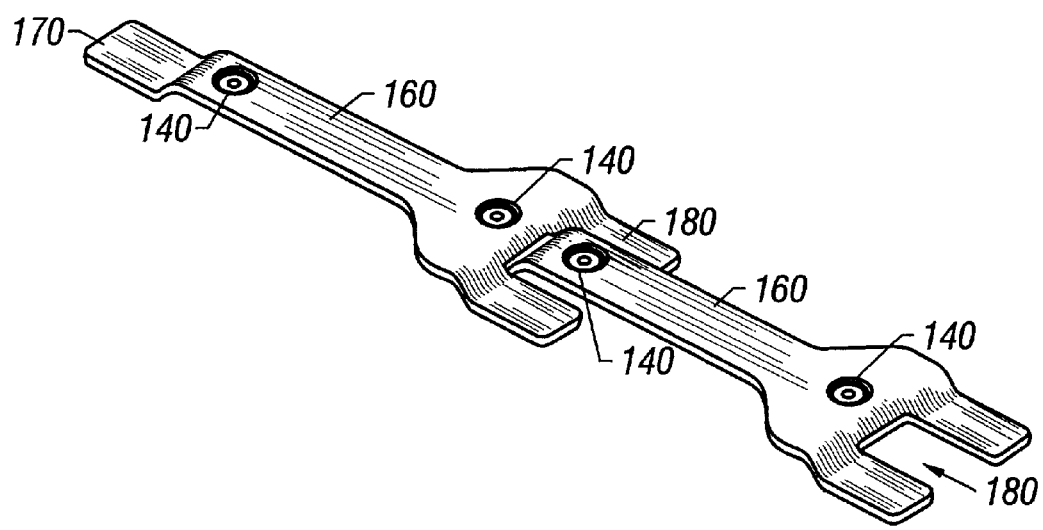

FIGS. 6A and 6B are perspective views of the pedestal 160 in accordance with the second embodiment of the present invention (FIG. 6A) and two of the pedestals 160 interlaced together (FIG. 6B). The pedestal 160 is a single bar with a single end 170 and a double end 180. The ends 170 and 180, respectively, are angled generally downwardly, or, alternatively, planar (not shown), and extended outwardly from opposite sides of the tower unit 100 (shown in FIG. 5) raising the base 120 of the tower unit 100 and preventing the tower unit 100 from overturning. The pedestal 160 is attached to the tower unit, for instance, with screws 140. When two or more tower units 100 are positioned adjacent each other with the front of the tower units 100 aligned with respect to each other, the single end 170 of the pedestal 160 on one tower unit 100 is interlaced with the double end 180 of the pedestal 160 on the adjacent tower unit 100 allowing the tower units 100 to be positioned in close proximity with respect to each other.

The present invention provides a simple stabilizing apparatus with the advantages of allowing computer system tower units to be positioned in close proximity with respect to each other while providing stability for a single or multiple tower units. While the tower unit described in the figures illustrates a hard drive array unit storage cabinet as part of a computer system, the stabilizing apparatus of the present invention may be used in any central computer system, server or computer subsystem where one or more computer system tower units are employed. Other embodiments are within the following claims, and, while only certain preferred features of the invention have been shown by way of illustration, many modifications and changes will occur. It is therefore to be understood that the present claims are intended to cover all such modifications and changes which fall within the true spirit of the invention.

What is claimed is:

1. A computer system comprising:

a tower unit having a generally narrow width base with respect to the depth and height of the tower unit;

a pedestal generally transverse to the depth of the tower unit, said pedestal being a single bar having:

a first end portion projecting from a first side of the tower unit a first distance from the front of the tower unit;

a second end portion protecting from a second side of the tower unit a second distance from the front of the tower unit; and a middle portion, the middle portion connecting the first and second end portions;

means for attaching the middle portion to the tower unit; and wherein the first end portion is adapted to interlace with a second end portion of an adjacent computer system.

2. The computer system of claim 1 wherein the first and second end portions are angled generally downward from the middle portion raising the tower unit above a surface for air to pass beneath the tower unit.

3. The computer system of claim 1 wherein the first and second end portions are angled generally to have an S-shape in opposite directions from each other and wherein the first end portion is adapted to interlace with a second end portion of an adjacent computer system.

4. The computer system of claim 1 wherein the first and second end portions stabilize the tower unit in an upright position.

5. The computer system of claim 1 wherein the first end portion is divided into a double end portion and the second end portion is a single end portion and wherein the single end portion is adapted to interlace with a double end portion of an adjacent computer system.

6. The computer system of claim 5 wherein the double end portion is adapted to interlace with a single end portion of an adjacent computer system.

7. The computer system of claim 1 further comprising at least one footpad being positioned at one end of the base of the tower unit wherein the pedestal is positioned at the other end of the base of the tower unit, and wherein the pedestal and the footpads raise the base of the tower unit.

8. The computer system of claim 1 wherein the means for attaching the middle portion to the tower unit comprises:

at least one screw for securing the middle portion to the base of the tower unit.

9. A stabilizing apparatus for a computer system tower unit, wherein the tower unit has a generally narrow width base with respect to the depth and height of the tower unit, said stabilizing apparatus comprising:

a pedestal for attachment to the tower unit in a direction generally transverse to the depth of the tower unit, said pedestal being a single bar having a first end portion, a second end portion, and a middle portion wherein the first and second end portions are angled downwardly from the middle portion; and means for attaching the pedestal to the tower unit, wherein the first end portion is adapted to interlace with a second end portion of an adjacent computer system tower unit.

10. The stabilizing apparatus of claim 9 wherein the first and second end portions are angled generally downward from the middle portion for raising the tower unit above a surface and for air to pass beneath the tower unit.

11. The stabilizing apparatus of claim 9 wherein the first and second end portions are angled generally in an S-shape in opposite directions from each other, wherein the first end portion is adapted to interlace with a second end portion of an adjacent computer system tower unit.

12. The stabilizing apparatus of claim 9 wherein the first and second end portions stabilize the tower unit in an upright position.

13. The stabilizing apparatus of claim 9 wherein the first end portion is divided into a double end portion and the second end portion is a single end portion, wherein the single end portion is adapted to interlace with a double end portion of an adjacent tower unit.

14. The stabilizing apparatus of claim 13 wherein the double end portion is adapted to interlace with a single end portion of an adjacent tower unit.

15. The stabilizing apparatus of claim 9 further comprising at least one footpad for raising the tower unit, the at least one footpad being positioned at one end of the base of the tower unit wherein the pedestal is positioned at the other end of the base of the tower unit.

16. The stabilizing apparatus of claim 9 wherein the means for attaching the middle portion to the tower unit comprises:
    at least one screw for securing the middle portion to the base of the tower unit.

17. A computer system comprising:
    a tower unit having a generally narrow width base with respect to the depth and height of the tower unit;
    a pedestal in a direction generally transverse to the depth of the tower unit, said pedestal being a single bar having a first end portion, a second end portion, and a middle portion connecting the first and second end portions, wherein the first and second end portions are angled generally in an S-shape in opposite directions from each other and downwardly from the middle portion raising the base of the tower unit above a surface for air to pass beneath the tower unit and wherein the first and second end portions extend outwardly from opposite sides of the tower unit for stabilizing the tower unit in an upright position; and
    means for attaching the middle portion to the tower unit;
    wherein, the first end portion is adapted to interlace with a second end portion of an adjacent computer system.

18. The computer system of claim 17 further comprising at least one footpad being positioned at one end of the base of the tower unit wherein the pedestal is positioned at the other end of the base of the tower unit, and wherein the pedestal and the footpads raise the base of the tower unit.

19. A computer system comprising:
    a tower unit having a generally narrow width base with respect to the depth and height of each tower unit;
    a pedestal generally transverse to the depth of the tower unit, said pedestal being a single bar having a first end portion, a second end portion, and a middle portion connecting the first and second end portions, wherein the first and second end portions are angled generally downwardly from the middle portion raising the base of the tower unit above a surface for air to pass beneath the tower unit, wherein the first and second end portions extend outwardly from opposite sides of the tower unit for stabilizing the tower unit in an upright position, and wherein the first end portion is divided into a double end portion and the second end portion is a single end portion; and
    means for attaching the pedestal to the tower unit;
    wherein, the single end portion is adapted to interlace with a double end portion of an adjacent computer system.

20. The stabilizing apparatus of claim 19 wherein the double end portion is adapted to interlace with a single end portion of an adjacent computer system.

* * * * *

UNITED STATES PATENT AND TRADEMARK OFFICE
CERTIFICATE OF CORRECTION

PATENT NO. : 6,193,208 B1                                    Page 1 of 1
DATED      : February 27, 2001
INVENTOR(S) : Schmitt, Ty R. and Wilks, Andrew W.

It is certified that error appears in the above-identified patent and that said Letters Patent is hereby corrected as shown below:

Column 4,
Line 8, delete "protecting" and insert -- projecting --.

Signed and Sealed this

Sixteenth Day of April, 2002

Attest:

JAMES E. ROGAN
*Attesting Officer*    *Director of the United States Patent and Trademark Office*